US012578394B2

(12) United States Patent
Lee et al.

(10) Patent No.: US 12,578,394 B2
(45) **Date of Patent: \*Mar. 17, 2026**

(54) BATTERY MANAGEMENT APPARATUS AND METHOD

(71) Applicant: LG ENERGY SOLUTION, LTD., Seoul (KR)

(72) Inventors: Hu-Jun Lee, Daejeon (KR); Jung-Hyun Kwon, Daejeon (KR); Jae-Dong Park, Daejeon (KR); Sang-Hoon Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 431 days.

This patent is subject to a terminal disclaimer.

(21) Appl. No.: 18/021,535

(22) PCT Filed: Oct. 5, 2021

(86) PCT No.: PCT/KR2021/013635
§ 371 (c)(1),
(2) Date: Feb. 15, 2023

(87) PCT Pub. No.: WO2022/075709
PCT Pub. Date: Apr. 14, 2022

(65) Prior Publication Data
US 2024/0012064 A1      Jan. 11, 2024

(30) Foreign Application Priority Data
Oct. 8, 2020     (KR) ........................ 10-2020-0130303

(51) Int. Cl.
*G01R 31/392*          (2019.01)
*G01R 31/367*          (2019.01)
(Continued)

(52) U.S. Cl.
CPC ......... *G01R 31/392* (2019.01); *G01R 31/367* (2019.01); *G01R 31/3835* (2019.01); *G01R 31/396* (2019.01)

(58) Field of Classification Search
CPC . G01R 31/392; G01R 31/396; G01R 31/3835
See application file for complete search history.

(56) References Cited

U.S. PATENT DOCUMENTS

2014/0320144 A1      10/2014  Nakaya
2015/0301122 A1      10/2015  Lee
(Continued)

FOREIGN PATENT DOCUMENTS

CN          204650329 U        9/2015
CN          106461732 A        2/2017
(Continued)

OTHER PUBLICATIONS

International Search Report issued in PCT/KR2021/013635 (PCT/ISA/210), mailed on Jan. 24, 2022.
(Continued)

*Primary Examiner* — Lam S Nguyen
(74) *Attorney, Agent, or Firm* — Birch, Stewart, Kolasch & Birch, LLP

(57)          ABSTRACT

Discussed is a battery management apparatus that can include a battery information measuring unit connected to a battery and configured to measure a voltage of the battery; and a control unit configured to receive from an outside, location information about a location where the battery is stored, receive battery information including the voltage of the battery from the battery information measuring unit, determine a target location where the battery is stored based on the received location information, obtain environment information of the determined target location, set reference state information of at least one reference cell stored around (Continued)

START

| BATTERY INFORMATION MEASURING STEP | ~S100 |

| TARGET LOCATION MEASURING STEP | ~S200 |

| ENVIRONMENT INFORMATION OBTAINING STEP | ~S300 |

| REFERENCE STATE INFORMATION SETTING STEP | ~S400 |

| BATTERY STATE JUDGING STEP | ~S500 |

| VOLTAGE MEASUREMENT CYCLE CHANGING STEP | ~S600 |

END the determined target location, and judge a state of the battery based on at least one of the received battery information.

15 Claims, 4 Drawing Sheets

(51) Int. Cl.
G01R 31/3835 (2019.01)
G01R 31/396 (2019.01)

(56) References Cited

U.S. PATENT DOCUMENTS

| | | | |
|---|---|---|---|
| 2017/0038436 A1 | 2/2017 | Montaru | |
| 2017/0062883 A1 | 3/2017 | Nakaya | |
| 2017/0144560 A1 | 5/2017 | Park et al. | |
| 2017/0324124 A1 | 11/2017 | Nakaya | |
| 2018/0145379 A1 | 5/2018 | You et al. | |
| 2018/0267106 A1 | 9/2018 | Kusano et al. | |
| 2018/0301770 A1 | 10/2018 | Nakaya | |
| 2021/0156923 A1 | 5/2021 | Nam et al. | |
| 2022/0215951 A1 | 7/2022 | Johannesson et al. | |
| 2023/0236263 A1* | 7/2023 | Lee ..................... | H01M 10/486 |
| | | | 429/9 |

FOREIGN PATENT DOCUMENTS

| | | | |
|---|---|---|---|
| JP | 2011-27435 A | | 2/2011 |
| JP | 2011-91940 A | | 5/2011 |
| JP | 2013-9531 A | | 1/2013 |
| JP | 2013-25323 A | | 2/2013 |
| JP | 5247874 B2 | | 7/2013 |
| JP | 5631426 B2 | | 11/2014 |
| JP | 2018-132440 A | | 8/2018 |
| JP | 2018-151269 A | | 9/2018 |
| JP | 2019-60774 A | | 4/2019 |
| JP | 2020-529024 A | | 10/2020 |
| JP | 2020-529104 A | | 10/2020 |
| JP | 2022-529886 A | | 6/2022 |
| KR | 10-1468314 B1 | | 12/2014 |
| KR | 10-2016-0051047 A | | 5/2016 |
| KR | 10-2017-0035229 A | | 3/2017 |
| KR | 10-2017-0060516 A | | 6/2017 |
| KR | 10-2018-0057046 A | | 5/2018 |
| KR | 10-2019-0012718 A | | 2/2019 |
| KR | 10-1960923 B1 | | 3/2019 |
| KR | 10-2020-0038005 A | | 4/2020 |
| KR | 10-2020-0038269 A | | 4/2020 |
| KR | 10-2156404 B1 | | 9/2020 |
| WO | WO 2019/023672 A1 | | 1/2019 |
| WO | WO 2019/023675 A1 | | 1/2019 |
| WO | WO 2019/023684 A1 | | 1/2019 |

OTHER PUBLICATIONS

Extended European Search Report for European Application No. 21877960.1, dated Feb. 8, 2024.

* cited by examiner

100

BATTERY MANAGEMENT APPARATUS

BATTERY INFORMATION MEASURING UNIT ~110

CONTROL UNIT ~120

ENVIRONMENT INFORMATION MEASURING UNIT ~130

STORAGE UNIT ~140

ALARM UNIT ~150

200

FIRST STATE PROFILE(P1)

REFERENCE STATE INFORMATION(Pref)

BATTERY MANAGEMENT APPARATUS AND METHOD

TECHNICAL FIELD

The present application claims priority to Korean Patent Application No. 10-2020-0130303 filed on Oct. 8, 2020 in the Republic of Korea, the disclosures of which are incorporated herein by reference.

The present disclosure relates to a battery management apparatus and method, and more particularly, to a battery management apparatus and method for judging a state of a battery in consideration of environment information of a storage location of a battery and information of surrounding batteries.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

These batteries have different characteristics when they are produced, and the rate of degradation is different according to the environment, so it is necessary to judge the state of the battery in consideration of the environment information of the battery.

Conventionally, in the process of manufacturing and distributing a battery, the performance of a battery loaded for a long period of time may deteriorate due to various reasons such as environmental factors such as temperature and humidity and self-discharge, but there is a limit in tracking and observing the same. Therefore, it is necessary to develop a technology that may accurately judge the state of the battery in consideration of the environment information of the location where the battery is stored or loaded.

DISCLOSURE

Technical Problem

The present disclosure is designed to solve the problems of the related art, and therefore the present disclosure is directed to providing a battery management apparatus and method for judging a state of a battery in consideration of environment information of a storage location of a battery and information of surrounding batteries.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery management apparatus according to an aspect of the present disclosure may include: a battery information measuring unit connected to a battery and configured to measure a voltage of the battery; and a control unit configured to receive from an outside, location information about a location where the battery is stored, receive battery information including the voltage of the battery from the battery information measuring unit, determine a target location where the battery is stored based on the received location information, obtain environment information of the determined target location, set reference state information of at least one reference cell stored around the determined target location, and judge a state of the battery based on at least one of the received battery information, the obtained environment information and the set reference state information.

The control unit may be further configured to change a voltage measurement cycle of the battery for the battery information measuring unit according to the judged state of the battery.

The control unit may be further configured to receive from the outside, storage period information for a storage period of the battery, and set the voltage measurement cycle in advance based on the storage period information and the judged state of the battery so that the battery information measuring unit measures the voltage of the battery a predetermined number of times during the storage period.

The control unit may be further configured to judge the state of the battery as a normal state or an abnormal state, and reduce the voltage measurement cycle of the battery information measuring unit for the battery when judged to be in the abnormal state.

A battery management apparatus according to another aspect of the present disclosure may further include an alarm unit configured to receive the judged state of the battery from the control unit and provide a light indicator when the judged state of the battery is the abnormal state.

The control unit may be further configured to set a first state profile for a predicted state of the battery based on the received battery information and the obtained environment information, set a second state profile for the predicted state of the battery based on the set first state profile and the set reference state information, and judge the state of the battery based on the set second state profile.

The control unit may be further configured to set the second state profile by correcting the set first state profile according to the reference state information.

The control unit may be further configured to set the second state profile at a first time point, and judge the state of the battery by comparing battery information received at a second time point later than the first time point with a predicted state of the second state profile corresponding to the second time point.

The control unit may be further configured to compare the set second state profile with a criterion profile and judge the state of the battery according to the comparison result.

The control unit may be configured to determine the target location based on the received location information, determine at least one cell stored at the target location as the at least one reference cell, and set reference state information corresponding to the determined at least one reference cell.

The at least one reference cell may be provided in a plurality.

The control unit may be further configured to obtain a plurality of reference information respectively corresponding to the plurality of reference cells, set the reference state information for the target location based on the plurality of obtained reference information, and set the second state profile according to the set first state profile and the set reference state information.

The location information may be information about a target section in which the battery is stored, among a plurality of sections divided so that the battery is stored therein.

A battery management apparatus according to still another aspect of the present disclosure may further include an environment information measuring unit configured to measure the environment information including at least one of temperature, humidity and air quality of the target location and send the measured environment information to the control unit.

A battery management method according to still another aspect of the present disclosure may include: a battery information measuring operation of measuring a voltage of the battery; a target location determining operation of determining a target location where the battery is stored based on location information about a location where the battery is stored, the location information being received from the outside; an environment information obtaining operation of obtaining environment information of the determined target location; a reference state information setting operation of setting reference state information of at least one reference cell stored around the determined target location; and a battery state judging operation of judging a state of the battery based on at least one of the battery information including the voltage of the battery measured in the battery information measuring operation, the environment information obtained in the environment information obtaining operation and the reference state information set in the reference state information setting operation.

A battery management method according to still another aspect of the present disclosure may further include a voltage measurement cycle changing operation of changing a voltage measurement cycle of the battery according to the state of the battery judged in the battery state judging operation.

Advantageous Effects

According to one aspect of the present disclosure, the battery management apparatus has an advantage of judging the state of the battery more accurately by considering not only the battery information but also the environment information about the target location where the battery is stored and the reference state information of the reference cell stored in the target location.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
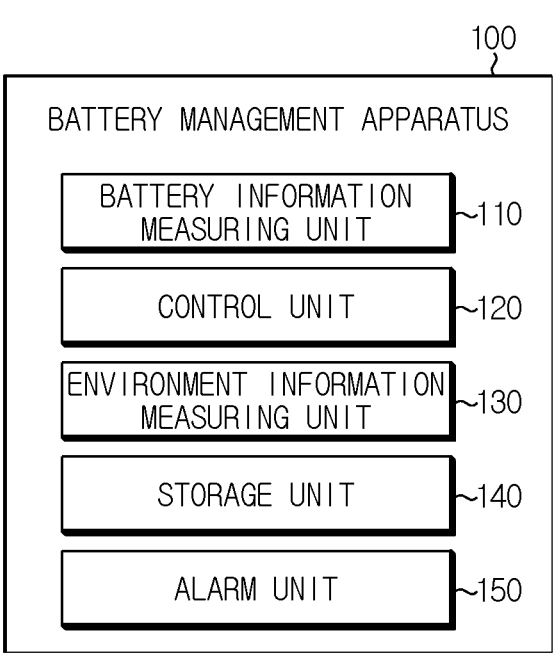
FIG. 1 is a diagram schematically showing a battery management apparatus according to an embodiment of the present disclosure.

FIG. 1 is a diagram schematically showing a battery management apparatus 100 according to an embodiment of the present disclosure.

Referring to FIG. 1, the battery management apparatus 100 according to an embodiment of the present disclosure may include a battery information measuring unit 110 and a control unit 120.

The battery information measuring unit 110 may be connected to a battery and configured to measure a voltage of the battery.

Here, the battery may refer to one physically separable independent cell including a negative electrode terminal and a positive electrode terminal. For example, one pouch-type lithium polymer cell may be regarded as a battery cell. In addition, the battery may mean a battery module in which two or more cells are connected in series and/or in parallel. However, hereinafter, for convenience of explanation, the battery will be described as meaning one cell.

Preferably, the battery information measuring unit 110 may be connected to one battery, respectively. In addition, the battery information measuring unit 110 may measure the voltage of the connected battery.

Also, specifically, the battery information measuring unit 110 may estimate a SOC and/or SOH of the battery based on the measured voltage of the battery. It should be noted that the battery information measuring unit 110 may further measure or estimate various battery information that can be used to judge the state of the battery, for example, current, internal resistance, temperature and swelling pressure.

The control unit 120 may be configured to receive location information about a location where the battery is stored from the outside.

For example, the control unit 120 may receive the location information about a location where the battery is stored from a user terminal.

Specifically, the user terminal may be configured to include an input unit. In addition, the user terminal may receive the information about the location where the battery is stored through the input unit. In addition, the user terminal may set location information for the location where the battery is stored based on the received information.

For example, the user terminal may be applied to various devices having an input unit, such as a mobile phone, a personal digital assistant (PDA), a personal computer (PC), and a tablet PC.

In addition, the user terminal may be configured to output the set location information to the control unit 120. To this end, the user terminal may be configured to enable wired communication and/or wireless communication. That is, the user terminal may output the set location information to the control unit 120, and the control unit 120 may receive the location information output from the user terminal.

The control unit 120 may be configured to receive the battery information including the voltage of the battery from the battery information measuring unit 110.

Preferably, the battery information measuring unit 110 and the control unit 120 may be connected to communicate with each other. The battery information measuring unit 110 may transmit the battery information including the measured voltage of the battery to the control unit 120, and the control unit 120 may receive the battery information from the battery information measuring unit 110.

The control unit 120 may be configured to determine a target location where the battery is stored based on the received location information.

The target location of the battery determined by the control unit 120 will be described in detail with reference to FIG. 2.

Figure 2:
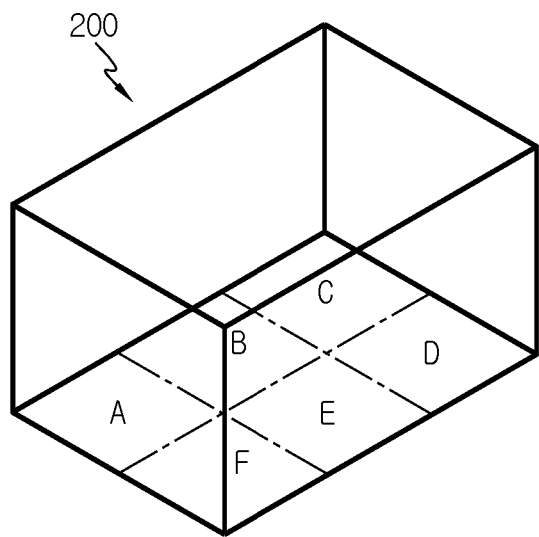
FIG. 2 is a diagram schematically showing a storage space in which a battery may be stored, in an embodiment of the present disclosure.

FIG. 2 is a diagram schematically showing a storage space 200 in which a battery may be stored, in an embodiment of the present disclosure.

In the embodiment of FIG. 2, the battery may be stored in the storage space 200. Here, the storage space 200 may be a space, such as a warehouse, a container and a trailer, in which the battery may be stored or loaded. For example, the storage space 200 may be divided into an A section, a B section, a C section, a D section, an E section, and an F section. That is, the battery may be stored in any one of the A section, the B section, the C section, the D section, the E section, and the F section.

Preferably, the user terminal may be configured to set the target section where the battery is stored among the plurality of divided sections as the location information. For example, it is assumed that the battery is stored in the A section. In this case, the A section may be a target section. The user terminal may set location information for the A section in which the battery is stored, and transmit the set location information to the control unit 120. The control unit 120 may receive the location information from the user terminal and determine the target location of the battery as the A section based on the received location information.

The control unit 120 may be configured to obtain environment information of the determined target location.

Referring to FIG. 1, the battery management apparatus 100 according to an embodiment of the present disclosure may further include an environment information measuring unit 130.

The environment information measuring unit 130 may be configured to measure environment information including at least one of temperature, humidity and air quality of the target location. Here, the air quality may mean the concentration of pollutants in the air of the target location. For example, the pollutants may include sulfur dioxide ($SO_2$), carbon monoxide (CO), nitrogen dioxide ($NO_2$), fine dust ($PM_{10}$, $PM_{2.5}$), and the like.

In addition, the environment information measuring unit 130 may be configured to transmit the measured environment information to the control unit 120.

Specifically, the environment information measuring unit 130 may receive the target location where the battery is stored from the control unit 120. The environment information measuring unit 130 may measure environment information including at least one of temperature, humidity and air quality of the target location. In addition, the environment information measuring unit 130 may transmit the measured environment information to the control unit 120.

For example, as in the previous embodiment, it is assumed that the battery is stored in the A section. The environment information measuring unit 130 may receive information about the A section from the control unit 120 as a target location. In addition, the environment information measuring unit 130 may measure environment information including at least one of temperature, humidity and air quality of the A section. In addition, the environment information measuring unit 130 may transmit the measured environment information to the control unit 120.

The control unit 120 may be configured to set reference state information Pref of at least one reference cell stored around the determined target location.

Here, the reference state information Pref of the reference cell may be a profile indicating the degradation of the reference cell. Specifically, the reference state information Pref may be a profile representing a correspondence between at least one of voltage, SOC and SOH of the reference cell and a storage time of the reference cell. Specific details of the reference state information Pref will be described later with reference to FIG. 4.

For example, at least one cell may be stored in advance in the storage space 200. In addition, the control unit 120 may be configured to obtain in advance the storage location of the at least one cell stored in advance in the storage space 200 and the state information of each cell. Accordingly, the control unit 120 may select at least one reference cell stored in advance near the determined target location for the battery among the at least one cell stored in advance in the storage space 200. In addition, the control unit 120 may set the reference state information Pref of the selected reference cell.

For example, as in the previous embodiment, it is assumed that the battery is stored in the A section. The control unit 120 may select at least one reference cell stored in the A section among the at least one cell stored in advance in the storage space 200. In addition, the control unit 120 may set the reference state information Pref for each of the selected at least one reference cell. Preferably, the control unit 120 may select all cells stored in the A section among the at least one cell stored in advance in the storage space 200 as reference cells.

The control unit 120 may be configured to judge the state of the battery based on at least one of the received battery information, the obtained environment information, and the set reference state information Pref.

Here, since the reference cell is a cell stored in advance at the target location, the reference state information Pref of the reference cell may be affected by the environment of the target location. For example, when the temperature of the target location exceeds the upper limit of the temperature range required for the battery, the reference cell may already be in a degraded state. In addition, the reference state information Pref of the reference cell may correspond to a degradation profile (e.g., a voltage profile) of the cell degraded by the influence of high temperature. Here, the voltage profile may be a profile representing a voltage change according to time.

Therefore, the control unit 120 may judge the state of the battery more accurately by considering not only the battery information received from the battery information measuring unit 110, but also the environment information about the target location where the battery is stored and the reference state information Pref of the reference cell stored in the target location.

That is, the battery management apparatus 100 according to an embodiment of the present disclosure may judge the state of the battery more accurately by considering not only the battery information but also the environment information about the target location where the battery is stored and the reference state information Pref of the reference cell stored in the target location.

Meanwhile, the control unit 120 according to an embodiment of the present disclosure may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 120 may be implemented as a set of program units. At this time, the program unit may be stored in a memory and executed by the control unit 120. The memory may be located inside or out of the control unit 120 and may be connected to the control unit 120 by various well-known means.

In addition, referring to FIG. 1 further, the battery management apparatus 100 according to an embodiment of the present disclosure may further include a storage unit 140. The storage unit 140 may store data necessary for operation and function of each component of the battery management apparatus 100, data generated in the process of performing the operation or function, or the like. The storage unit 140 is not particularly limited in its kind as long as it is a known information storage means that can record, erase, update and read data. As an example, the information storage means may include RAM, flash memory, ROM, EEPROM, registers, and the like. In addition, the storage unit 140 may store program codes in which processes executable by the control unit 120 are defined.

For example, the voltage of the battery measured by the battery information measuring unit 110 may be stored in the storage unit 140. That is, the voltage information about the battery may be accumulated and stored in the storage unit 140. Therefore, in the process of performing various analysis on the battery judged to be in an abnormal state, the voltage information of the battery accumulated in the storage unit 140 may be used.

The control unit 120 may be configured to change a voltage measurement cycle of the battery by the battery information measuring unit 110 according to the judged state of the battery.

For example, the control unit 120 may be configured to judge the state of the battery as a normal state or an abnormal state.

Here, the normal state means a state in which the battery stored in the target location is degraded according to a general degradation rate. Conversely, the abnormal state means a state in which the battery stored in the target location is degraded faster than the general degradation rate.

If the state of the battery is judged as an abnormal state by the control unit 120, the control unit 120 may be configured to reduce the voltage measurement cycle of the battery information measuring unit 110 for the battery judged as in the abnormal state.

Specifically, the control unit 120 may reduce the voltage measurement cycle of the battery information measuring unit 110 so that the voltage of the battery is measured in a shorter cycle. That is, the control unit 120 may the voltage information about the battery in the abnormal state by reducing the voltage measurement cycle of the battery information measuring unit 110 so that the voltage of the battery judged as in the abnormal state is measured with a shorter cycle. Preferably, the voltage information may be data for analyzing the degree of degradation of the battery in the abnormal state from various aspects.

That is, the control unit 120 may reduce the voltage measurement cycle for the battery from a time point at which the state of the battery is judged as an abnormal state, so that more voltage information about the battery is accumulatively obtained.

The battery management apparatus 100 has an advantage of securing more voltage information about the battery by changing the voltage measurement cycle of the corresponding battery judged as in an abnormal state.

In addition, referring to FIG. 1 further, the battery management apparatus 100 according to an embodiment of the present disclosure may further include an alarm unit 150.

The alarm unit 150 may be configured to receive the judged state of the battery from the control unit 120, and to light on when the judged state of the battery is an abnormal state.

For example, the alarm unit 150 may be a light emitting diode (LED) module capable of communicating with the control unit 120. That is, when the alarm unit 150 receives the information that the state of the battery is an abnormal state from the control unit 120, the alarm unit 150 may light on to inform the outside that the battery is in an abnormal state.

Preferably, in the embodiment of FIG. 2, the alarm unit 150 may be provided for each section. Therefore, in the corresponding section, the alarm unit 150 may effectively inform the outside that the battery is in an abnormal state.

For example, it is assumed that the battery is stored in the A section as in the previous embodiment, and the state of the battery is judged as an abnormal state by the control unit 120. The control unit 120 may send the information that the state of the battery is an abnormal state to the alarm unit 150 corresponding to the A section. The alarm unit 150 receiving the information that the state of the battery is an abnormal state may light on to inform the outside of the information that the battery in an abnormal state is stored in the A section.

The battery management apparatus 100 has an advantage of effectively informing the outside of the existence of a battery in an abnormal state through an alarm.

Hereinafter, with reference to FIGS. 3 to 6, the content in which the control unit 120 judges the state of the battery will be described in detail.

Figure 3:
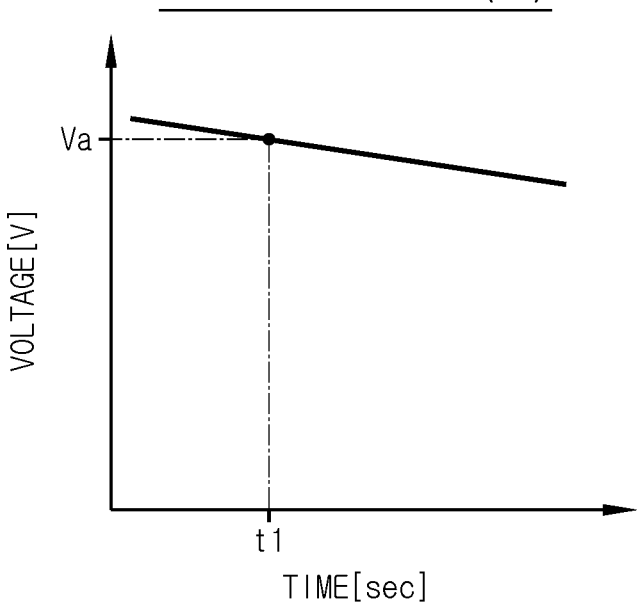
FIG. 3 is a diagram schematically showing an example of a first state profile set by the battery management apparatus according to an embodiment of the present disclosure.
Figure 4:
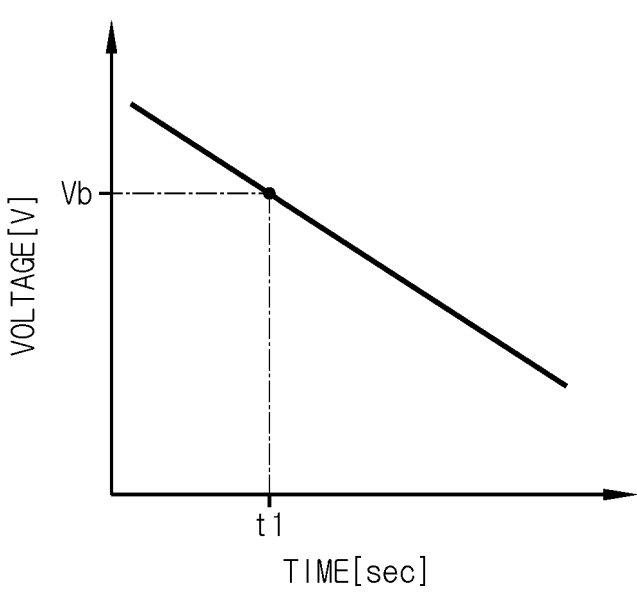
FIG. 4 is a diagram schematically showing an example of reference state information set by the battery management apparatus according to an embodiment of the present disclosure.
Figure 5:
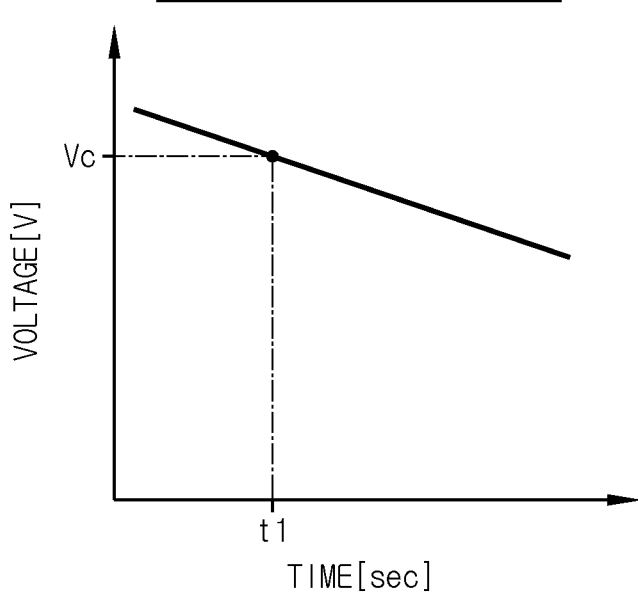
FIG. 5 is a diagram schematically showing an example of a second state profile set by the battery management apparatus according to an embodiment of the present disclosure.

FIG. 3 is a diagram schematically showing an example of a first state profile P1 set by the battery management apparatus 100 according to an embodiment of the present disclosure. FIG. 4 is a diagram schematically showing an example of reference state information Pref set by the battery management apparatus 100 according to an embodiment of the present disclosure. FIG. 5 is a diagram schematically showing an example of a second state profile P2 set by the battery management apparatus 100 according to an embodiment of the present disclosure.

Here, the first state profile P1, the second state profile P2, and the reference state information Pref may be profiles representing a correspondence between at least one of voltage value, SOC and SOH of the reference cell and a storage time of the reference cell. However, hereinafter, for convenience of explanation, the first state profile P1 and the second state profile P2 will be described as voltage profiles representing the predicted voltage of the battery according to the storage time. In addition, the reference state information Pref will be described as a voltage profile representing the voltage change of the reference cell according to the storage time.

The control unit 120 may be configured to set the first state profile P1 for a predicted state of the battery based on the received battery information and the obtained environment information.

Preferably, the control unit 120 may include an algorithm capable of setting a state profile for the battery based on the received battery information and the received environment information.

For example, a machine learning algorithm may be applied to the control unit 120. In addition, when receiving the battery information and the environment information, the control unit 120 may set a state profile for the battery based on the input battery information and environment information. More specifically, when the battery information and the environment information are input to the control unit 120, a learned model may be set in advance to set the state profile for the battery.

For example, in the embodiment of FIG. 3, the control unit 120 may set the first state profile P1 for the battery based on the battery information received from the battery information measuring unit 110 and the environment information received from the environment information measuring unit 130.

The control unit 120 may be configured to set the second state profile P2 for the predicted state of the battery based on the set first state profile P1 and the set reference state information Pref.

As described above, the reference state information Pref may be a voltage profile of the reference cell in which the environment information of the target location is reflected. That is, the reference state information Pref may be an actual voltage profile of the reference cell to which the environment information of the target location is directly reflected.

Accordingly, the control unit 120 may be configured to set the second state profile P2 by correcting the set first state profile P1 according to the reference state information Pref. That is, the control unit 120 may set the second state profile P2 by fitting the first state profile P1 according to the reference state information Pref.

For example, in the embodiment of FIGS. 3 and 4, the control unit 120 may calculate an average value between a voltage value Va of the first time point t1 of the first state profile P1 and a voltage value Vb of the first time point t1 of the reference state information Pref. The average of the voltage values calculated for the first time point t1 may be a voltage value Vc of the second state profile P2. In this way, the control unit 120 may set the second state profile P2 by calculating the average of the voltage values per time between the first state profile P1 and the reference state information Pref.

In the above, the embodiment in which the control unit 120 sets the second state profile P2 as an average value between the voltage value per time of the first state profile P1 and the voltage value per time of the reference state information Pref has been described. However, the method for the control unit 120 to set the second state profile P2 based on the first state profile P1 and the reference state information Pref is not limited to the method using the average of voltage values, and it should be noted that various method using a median value theorem for voltage values per time, a mean square error or a mean absolute error may be applied.

The control unit 120 may be configured to judge the state of the battery based on the set second state profile P2.

Specifically, the control unit 120 may be configured to set the second state profile P2 at the first time point t1, and judge the state of the battery by comparing the battery information received at the second time point t2 later than the first time point t1 with the predicted state of the second state profile P2 corresponding to the second time point t2.

For example, the control unit 120 may set the second state profile P2 for the predicted state of the battery at the first time point t1 based on the received at least one battery information, the received at least one environment information, and the received at least one reference state information Pref. In addition, the control unit 120 may judge the state of the battery according to a result of comparing the battery information received at the second time point t2 with the predicted state according to the second state profile P2 at the second time point t2.

Figure 6:
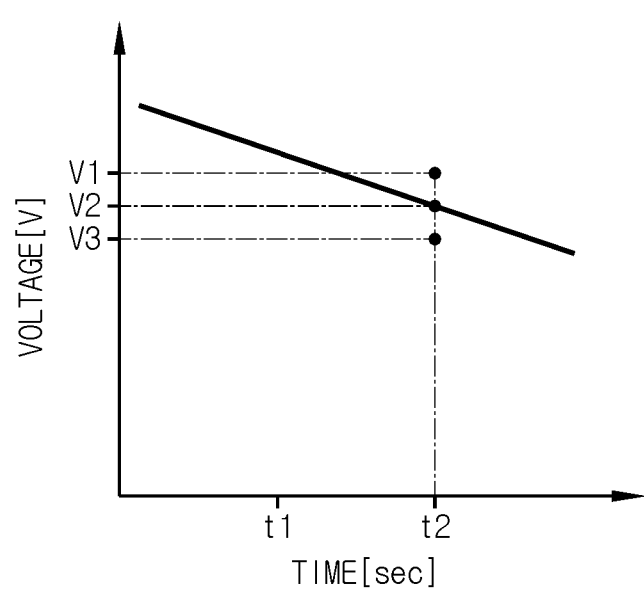
FIG. 6 is a diagram schematically showing an example of judging a state of a battery by the battery management apparatus according to an embodiment of the present disclosure.

FIG. 6 is a diagram schematically showing an example of judging a state of a battery by the battery management apparatus 100 according to an embodiment of the present disclosure.

Specifically, FIG. 6 is an embodiment in which the state of the battery is judged according to the battery state information measured at the second time point t2 after the second state profile P2 is set at the first time point t1.

First, in the embodiment of FIG. 6, it is assumed that the voltage value of the battery obtained by the battery information measuring unit 110 at the second time point t2 is the first voltage value V1, and the voltage value of the battery predicted by the second state profile P2 is the second voltage value V2. In this case, since the first voltage value V1 that is an actually measured voltage value is greater than the second voltage value V2 that is a voltage value predicted according to the second state profile P2, the control unit 120 may judge the state of the battery as a normal state.

Conversely, in the embodiment of FIG. 6, it is assumed that the voltage value of the battery obtained by the battery information measuring unit 110 at the second time point t2 is the third voltage value V3, and the voltage value of the battery predicted by the second state profile P2 is the second voltage value V2. In this case, since the third voltage value V3 that is an actually measured voltage value is smaller than the second voltage value V2 that is a voltage value predicted according to the second state profile P2, the control unit 120 may judge the state of the battery as an abnormal state.

Thereafter, the control unit 120 may reset the first state profile P1 for the predicted state of the battery at the second time point t2 based on the at least one battery information and the at least one environment information received up to the second time point t2. In addition, the control unit 120 may reset the second state profile P2 at the second time point t2 based on the reset first state profile P1 and the reference state information Pref. In addition, by using the reset second state profile P2, the state of the battery may be judged according to the battery information received at the third time point later than the second time point t2.

The battery management apparatus 100 according to an embodiment of the present disclosure may judge the state of the battery based on the battery information, the environment information and the reference state information Pref, and update the second state profile P2. That is, since the second state profile P2 for judging the state of the battery may be continuously updated based on the latest information of the battery, the accuracy of judging the state of the battery by the battery management apparatus 100 may be continuously improved.

As another embodiment for judging the state of the battery, the control unit 120 may be configured to compare the set second state profile P2 with a criterion profile, and judge the state of the battery according to the comparison result.

Here, the criterion profile may be a degradation profile (e.g., a voltage profile) for a criterion cell of the same type as the battery. That is, the criterion cell is differentiated from the reference cell stored in the target location of the storage space 200, and may be a cell prepared to obtain a criterion profile for the battery. Therefore, the criterion profile may be a profile in which the environment information of the target location is not reflected.

For example, the control unit 120 may judge the state of the battery according to a result of comparing the voltage value of the second state profile P2 with the voltage value of the criterion profile. At any one time point, if the predicted voltage value according to the second state profile P2 is less than the criterion voltage value according to the criterion profile, the control unit 120 may judge the state of the battery at the corresponding time point as an abnormal state. Conversely, at any one time point, if the predicted voltage value according to the second state profile P2 is equal to or greater than the criterion voltage value according to the criterion profile, the control unit 120 may judge the state of the battery at the corresponding time point as a normal state.

As another example, the control unit 120 may compare a match rate between the set second state profile P2 and the criterion profile, and judge the state of the battery according to whether the match rate is equal to or greater than a predetermined rate. In particular, when the predicted voltage of the battery according to the second state profile P2 decreases faster than the voltage of the criterion cell according to the criterion profile, the control unit 120 may judge the state of the battery as an abnormal state.

The control unit 120 may be configured to determine the target location based on the received location information and determine at least one cell stored at the target location as the reference cell. In addition, the control unit 120 may be configured to set the reference state information Pref corresponding to the determined reference cell.

Specifically, the control unit 120 may determine a location where the battery is stored in the storage space 200 as the target location. In addition, the control unit 120 may determine at least one cell stored at the target location as a reference cell.

That is, the control unit 120 may select a reference cell stored at a location adjacent to the battery among the cells stored in the storage space 200, and judge the state of the battery based on the reference state information Pref of the selected reference cell. Therefore, in the process of judging the state of the battery, the interference of the environment for locations other than the target location may be reduced, so the accuracy of judging the state of the battery by the battery management apparatus 100 according to an embodiment of the present disclosure may be improved.

Specifically, a plurality of reference cells may be stored in the target location. For example, when the target location in which the battery is stored is the A section, a plurality of reference cells may be stored in advance in the A section.

The control unit 120 may be configured to obtain a plurality of reference information respectively corresponding to the plurality of reference cells. Here, the reference information may be a degradation profile of each reference cell.

The storage unit 140 may be configured to store reference information of each of the at least one cell stored in the storage space 200. In addition, the storage unit 140 and the control unit 120 may be connected to communicate with each other.

The control unit 120 may access the storage unit 140 to obtain the reference information for each of the plurality of reference cells stored in the target location.

Further, the control unit 120 may be configured to set the reference state information Pref for the target location based on the plurality of obtained reference information.

Specifically, the control unit 120 may collect the plurality of obtained reference information to set one reference state information Pref for the target location.

For example, it is assumed that 5 reference cells are stored in advance in the target location. The control unit 120 may access the storage unit 140 to obtain 5 pieces of reference information for 5 reference cells stored in the target location. In addition, the control unit 120 may set one reference state information Pref for the target location based on the obtained 5 pieces of reference information.

As another example, it is assumed that one reference cell is stored in advance in the target location. The control unit 120 may access the storage unit 140 to obtain the reference information for one reference cell stored in the target location. In addition, the control unit 120 may set one reference state information Pref for the target location based on the obtained one piece of reference information.

The control unit 120 may set one reference state information Pref based on the plurality of reference information using various methods such as the mean value theorem, the median value theorem, the mean square error, or the mean absolute error, without limitation.

In addition, the control unit 120 may be configured to set the second state profile P2 according to the set first state profile P1 and the set reference state information Pref.

That is, the second state profile P2 set by the control unit 120 may be a profile set in consideration of not only the battery information and the environment information of the target location but also the reference information of the plurality of reference cells stored in the target location.

Therefore, since the second state profile P2 is a profile set in consideration of the influence of the environment of the target location on the plurality of reference cells stored in the target location, the accuracy and reliability of judging the state of the battery based on the second state profile P2 may be improved.

The user terminal may be configured to further set specification information for the battery.

For example, the specification information may be configured to include at least one of a battery type, a manufacturer, components of an active material, and a manufacturing time. However, the specification information of the battery that can be set by the user terminal is not limited only to this embodiment, but, for example, more various information related to the specification of the battery such as a maximum capacity of the battery may be set.

The control unit 120 may be configured to receive the specification information from the user terminal and determine a cell having the same specification as the received specification information among the at least one cell stored in the target location as the reference cell.

Specifically, the control unit 120 may select at least one cell stored in the target location among the at least one cell stored in advance in the storage space 200. In addition, the control unit 120 may check the specification information of the selected at least one cell and determine at least one cell having the same specification information as the battery as the reference cell. Here, the specification information for the at least one cell stored in advance in the storage space 200 may be stored in advance in the storage unit 140.

That is, in the process of judging the state of the battery, the control unit 120 may more specifically consider the influence of the environment of the target location on the reference cell having the same specification information as the battery. Therefore, since the second state profile P2 may be set by reflecting the specification information of the battery, the accuracy of judging the state of the battery based on the second state profile P2 may be improved.

The control unit 120 may be configured to receive storage period information about a storage period of the battery from the outside.

That is, the user terminal may be configured to further set the storage period of the battery. In addition, the control unit 120 may receive the storage period information about the storage period of the battery from the user terminal.

The control unit 120 may be configured to set the voltage measurement cycle in advance based on the storage period information and the judged state of the battery so that the battery information measuring unit 110 may measure the voltage of the battery a predetermined number of times during the storage period.

For example, in order to reduce unnecessary power consumption, the battery information measuring unit 110 may not be configured to always maintain a wake-up state. The battery information measuring unit 110 may be configured to operate every set wake-up cycle (e.g., a voltage measurement cycle) to obtain battery information. That is, the wake-up period of the battery information measuring unit 110 may be set by the storage period of the battery.

For example, the battery information measuring unit 110 may be set to measure the battery information at least 100 times so that the state of the battery may be judged at more various time points. In addition, the storage period of the battery set by the user terminal may be 100 hours. In this case, the control unit 120 may set the wake-up period of the battery information measuring unit 110 to 1 hour or less, so that the battery information may be obtained 100 times or more by the battery information measuring unit 110.

Therefore, since the battery information measuring unit 110 operates according to the wake-up cycle set according to the storage period of the battery, there is an advantage of reducing unnecessary power consumption and securing sufficient battery information to judge the state of the battery.

Figure 7:
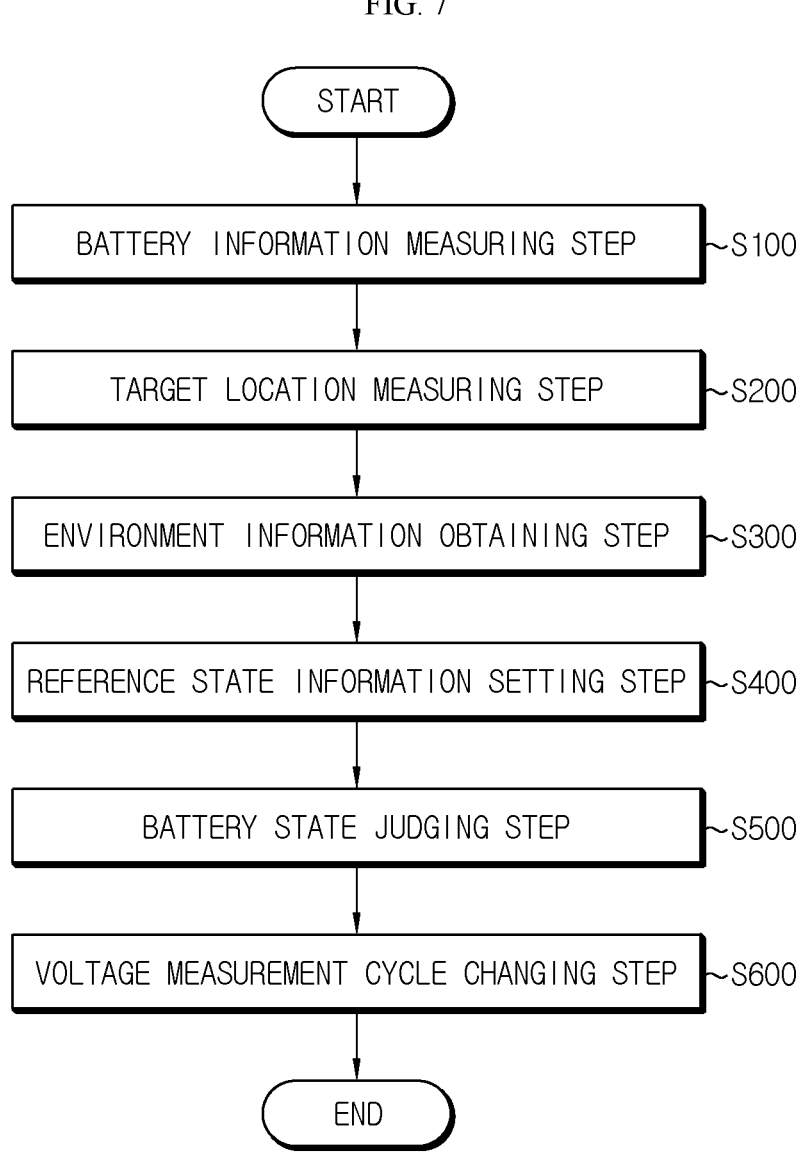
FIG. 7 is a diagram schematically showing a battery state management method according to another embodiment of the present disclosure.

FIG. 7 is a diagram schematically showing a battery management method according to another embodiment of the present disclosure.

Here, each step of the battery management method may be performed by the battery management apparatus 100. Hereinafter, for convenience of description, content overlapping with the previously described content will be briefly described or omitted.

Referring to FIG. 7, the battery management method may include a battery information measuring step (S100), a target location determining step (S200), an environment information obtaining step (S300), a reference state information Pref setting step (S400), a battery state judging step (S500) and a voltage measurement cycle changing step (S600).

The battery information measuring step (S100) is a step of measuring the voltage of the battery, and may be performed by the battery information measuring unit 110.

For example, the battery information measuring unit 110 may measure the voltage of the connected battery.

The target location determining step (S200) is a step of determining the target location where the battery is stored based on location information about a location where the battery is stored received from the outside, and may be performed by the control unit 120.

For example, the control unit 120 may receive the location information about a location where the battery is stored from the user terminal. In addition, the control unit 120 may determine the target location based on the received location information.

In the embodiment of FIG. 2, it is assumed that the battery is stored in the A section of the storage space 200. The control unit 120 may receive the location information about the A section in which the battery is stored from the user terminal. In addition, the control unit 120 may determine the A section in which the battery is stored as the target location.

The environment information obtaining step (S300) is a step of obtaining environment information of the determined target location, and may be performed by the control unit 120.

Specifically, the environment information of the target location may be measured by the environment information measuring unit 130. In addition, the control unit 120 may receive the environment information of the target location from the environment information measuring unit 130.

The reference state information Pref setting step (S400) is a step of setting the reference state information Pref of at least one reference cell stored around the determined target location, and may be performed by the control unit 120.

For example, when a plurality of reference cells are provided in the target location, the control unit 120 may obtain reference information of each of the plurality of reference cells, and collect the plurality of obtained reference information to set one reference state information Pref for the target location.

The battery state judging step (S500) is a step of judging the state of the battery based on at least one of the battery information including the voltage of the battery measured in the battery information measuring step (S100), the environment information obtained in the environment information obtaining step (S300) and the reference state information Pref set in the reference state information Pref setting step (S400), and may be performed by the control unit 120.

For example, the control unit 120 may set the first state profile P1 based on the battery information and the environment information. In addition, the control unit 120 may set the second state profile P2 by correcting the first state profile P1 according to the reference state information Pref. In addition, the control unit 120 may judge the state of the battery by comparing the predicted voltage of the battery according to the second state profile P2 with an actually measured voltage of the battery.

The voltage measurement cycle changing step (S600) is a step of changing a voltage measurement cycle of the battery according to the state of the battery judged in the battery state judging step (S500), and may be performed by the control unit 120.

For example, when the state of the battery is judged as an abnormal state, the control unit 120 may reduce the voltage measurement cycle of the battery measured by the battery information measuring unit 110. That is, in the case of a battery in an abnormal state, the voltage is measured more frequently, and the measured voltage information may be accumulatively stored in the storage unit 140.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

100: battery management apparatus
110: battery information measuring unit
120: control unit
130: environment information measuring unit
140: storage unit
150: alarm unit
200: storage space

What is claimed is:

1. A battery management apparatus, comprising:
a battery information measuring unit connected to a battery and configured to measure a voltage of the battery; and
a control unit configured to:
receive from an outside, location information about a location where the battery is stored,
receive battery information including the voltage of the battery from the battery information measuring unit,
determine a target location where the battery is stored based on the received location information,
obtain environment information of the determined target location,
set reference state information of at least one reference cell stored around the determined target location, and
judge a state of the battery based on at least one of the received battery information, the obtained environment information and the set reference state information.

2. The battery management apparatus according to claim 1, wherein the control unit is further configured to change a voltage measurement cycle of the battery for the battery information measuring unit according to the judged state of the battery.

3. The battery management apparatus according to claim 2, wherein the control unit is further configured to:
receive from the outside, storage period information for a storage period of the battery, and
set the voltage measurement cycle in advance based on the storage period information and the judged state of the battery so that the battery information measuring unit measures the voltage of the battery a predetermined number of times during the storage period.

4. The battery management apparatus according to claim 2, wherein the control unit is further configured to:
judge the state of the battery as a normal state or an abnormal state, and
reduce the voltage measurement cycle of the battery information measuring unit for the battery when judged to be in the abnormal state.

5. The battery management apparatus according to claim 4, further comprising:
an alarm unit configured to receive the judged state of the battery from the control unit and provide a light indicator when the judged state of the battery is the abnormal state.

6. The battery management apparatus according to claim 1, wherein the control unit is further configured to:
set a first state profile for a predicted state of the battery based on the received battery information and the obtained environment information,
set a second state profile for the predicted state of the battery based on the set first state profile and the set reference state information, and
judge the state of the battery based on the set second state profile.

7. The battery management apparatus according to claim 6, wherein the control unit is further configured to set the second state profile by correcting the set first state profile according to the reference state information.

8. The battery management apparatus according to claim 6, wherein the control unit is further configured to:
set the second state profile at a first time point, and
judge the state of the battery by comparing battery information received at a second time point later than the first time point with a predicted state of the second state profile corresponding to the second time point.

9. The battery management apparatus according to claim 6, wherein the control unit is further configured to compare the set second state profile with a criterion profile and judge the state of the battery according to the comparison result.

10. The battery management apparatus according to claim 6, wherein the control unit is further configured to:

determine the target location based on the received location information, determine at least one cell stored at the target location as the at least one reference cell, and set reference state information corresponding to the determined at least one reference cell.

11. The battery management apparatus according to claim 10, wherein the at least one reference cell is provided in a plurality, and wherein the control unit is further configured to:

obtain a plurality of reference information respectively corresponding to the plurality of reference cells, set the reference state information for the target location based on the plurality of obtained reference information, and set the second state profile according to the set first state profile and the set reference state information.

12. The battery management apparatus according to claim 1, wherein the location information is information about a target section in which the battery is stored, among a plurality of sections divided so that the battery is stored therein.

13. The battery management apparatus according to claim 1, further comprising:

an environment information measuring unit configured to measure the environment information including at least one of temperature, humidity and air quality of the target location and send the measured environment information to the control unit.

14. A battery management method, comprising:

a battery information measuring operation of measuring a voltage of the battery;

a target location determining operation of determining a target location where the battery is stored based on location information about a location where the battery is stored, the location information being received from the outside;

an environment information obtaining operation of obtaining environment information of the determined target location;

a reference state information setting operation of setting reference state information of at least one reference cell stored around the determined target location; and a battery state judging operation of judging a state of the battery based on at least one of the battery information including the voltage of the battery measured in the battery information measuring operation, the environment information obtained in the environment information obtaining operation and the reference state information set in the reference state information setting operation.

15. The battery management method according to claim 14, after the battery state judging operation, further comprising:

a voltage measurement cycle changing operation of changing a voltage measurement cycle of the battery according to the state of the battery judged in the battery state judging operation.

* * * * *